United States Patent [19]

Nitayama et al.

[11] Patent Number: 5,311,050

[45] Date of Patent: May 10, 1994

[54] SEMICONDUCTOR VERTICAL MOSFET INVERTER CIRCUIT

[75] Inventors: Akihiro Nitayama, Kawasaki; Koji Sakui, Tokyo, both of Japan

[73] Assignee: Kabushiki Kaisha Toshiba, Kawasaki, Japan

[21] Appl. No.: 796,602

[22] Filed: Nov. 22, 1991

[30] Foreign Application Priority Data

Nov. 30, 1990 [JP] Japan .................................. 2-340400

[51] Int. Cl.$^5$ ............................................. H01L 29/78
[52] U.S. Cl. ................................. 257/330; 257/331; 257/369; 257/372
[58] Field of Search ................. 257/330, 331, 369, 372

[56] References Cited

U.S. PATENT DOCUMENTS

| | | | |
|---|---|---|---|
| 3,518,509 | 6/1970 | Cullis | 257/369 |
| 4,740,826 | 4/1988 | Chatterjee | 307/451 |
| 4,810,906 | 3/1989 | Shah et al. | 307/451 |
| 5,140,388 | 8/1992 | Bartelink | 257/369 |

FOREIGN PATENT DOCUMENTS

| | | |
|---|---|---|
| 0098111 | 1/1984 | European Pat. Off. . |
| 2-71556 | 3/1990 | Japan . |
| 2-188966 | 7/1990 | Japan . |

*Primary Examiner*—Robert Limanek
*Attorney, Agent, or Firm*—Oblon, Spivak, McClelland, Maier & Neustadt

[57] ABSTRACT

A semiconductor device including a semiconductor substrate 1 and at least one first column-shaped semiconductor layer 10 of a first channel type formed on semiconductor substrate 1 in order of first, second and third regions, and having a side surface. At least one second column-shaped semiconductor layer 11 of a second channel type is selectively laminated on first semiconductor layer 10 in order of first, second and third regions, and having a side surface. A gate insulation film 8 is formed on the side surfaces of first semiconductor layer 10 and second semiconductor layer 11. A gate electrode 9 is formed on the insulation film 8 extending to an external portion of first semiconductor layer 10. A first source layer 2 and first drain layer 4 are respectively formed in the first and third regions of first semiconductor layer 10. A second source layer 7 and second drain layer 5 are respectively formed in the first and third regions of semiconductor layer 11. An input terminal 14 is connected to gate electrode 9 to lead out to the exterior of first semiconductor layer 10. An output terminal 15 is connected to second drain layer 5 formed on and in low-resistance contact with first drain layer. A first power source terminal 16 is connected to first source layer 2 of first semiconductor layer 10, and a second power source terminal 17 is connected to second source layer 7.

10 Claims, 12 Drawing Sheets

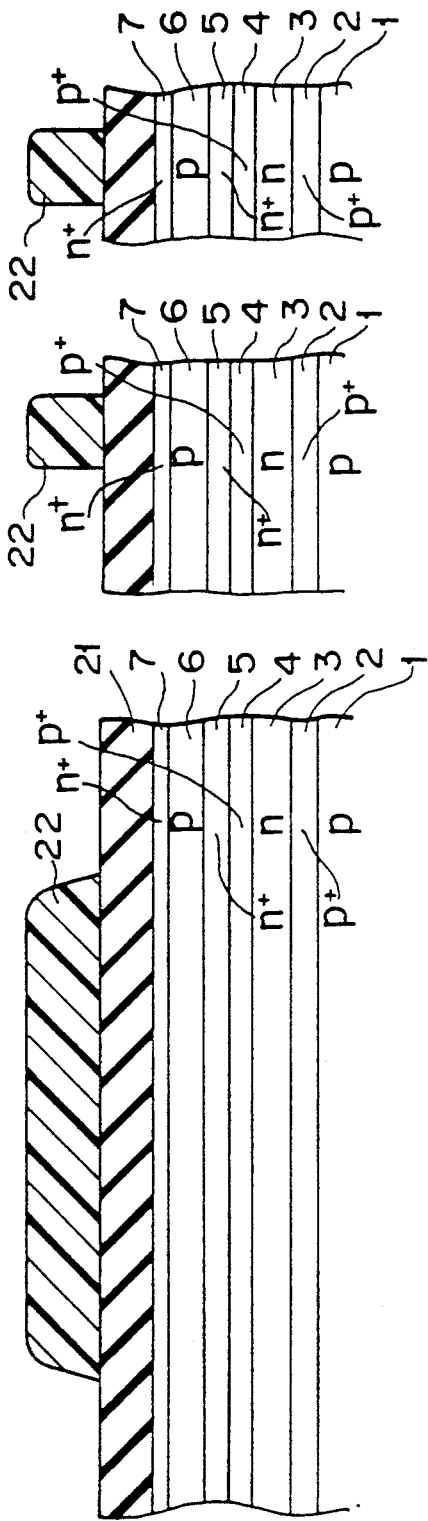
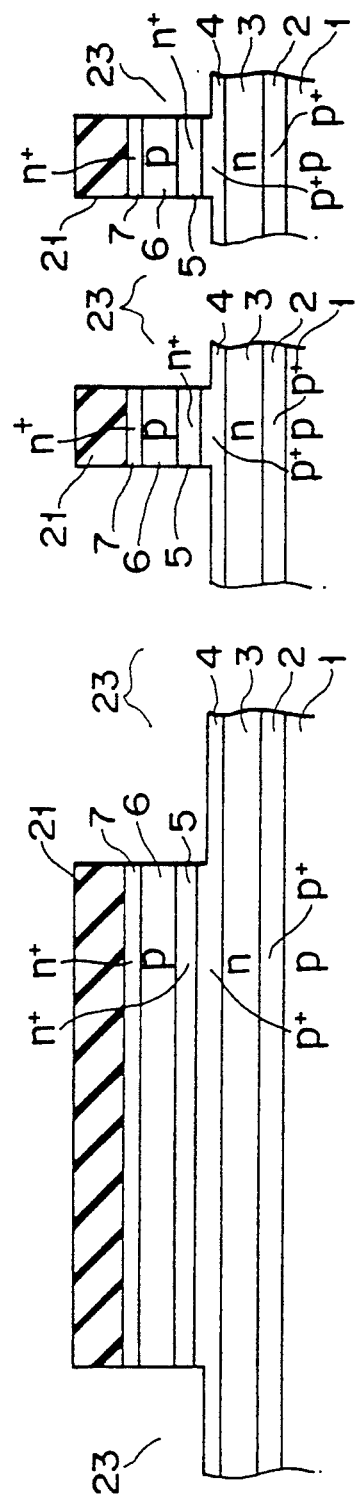
FIG. 4A　FIG. 4B　FIG. 4C
FIG. 5A　FIG. 5B　FIG. 5C

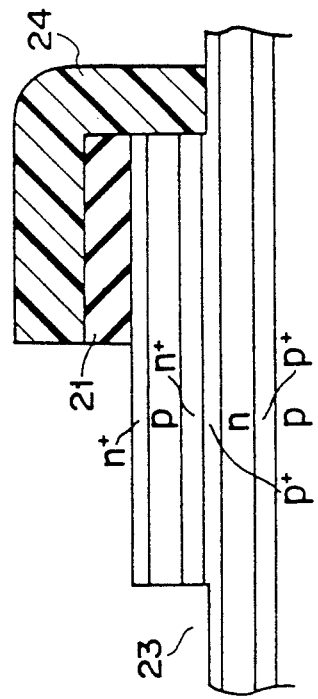
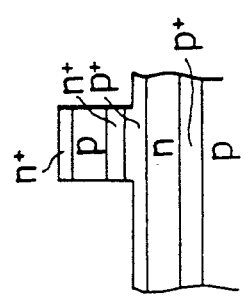
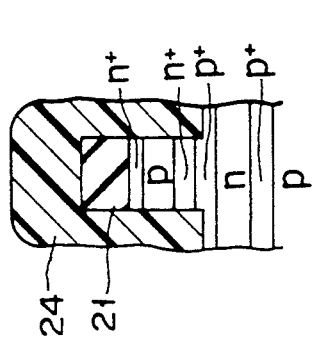
FIG. 6A    FIG. 6B    FIG. 6C
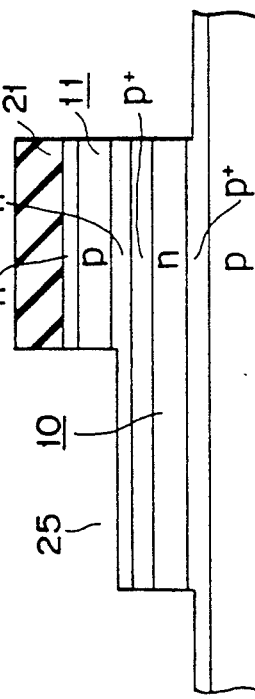
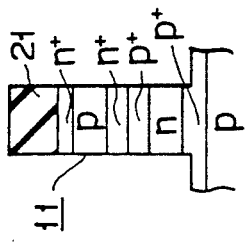
FIG. 7A    FIG. 7B    FIG. 7C
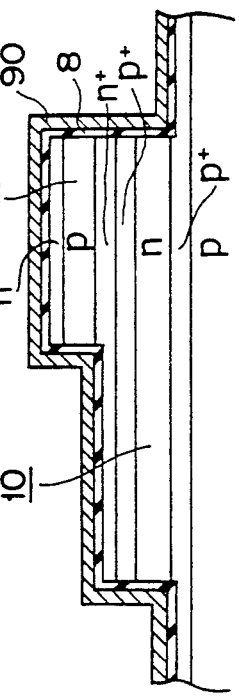
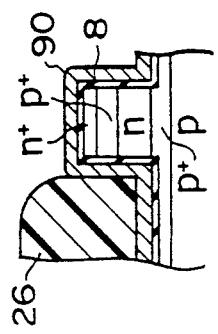
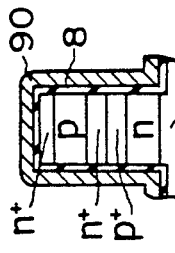
FIG. 8A    FIG. 8B    FIG. 8C

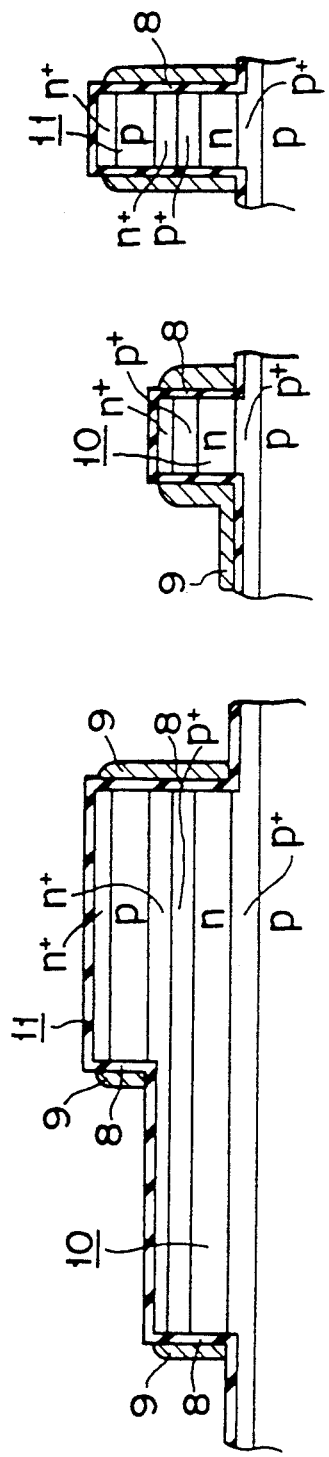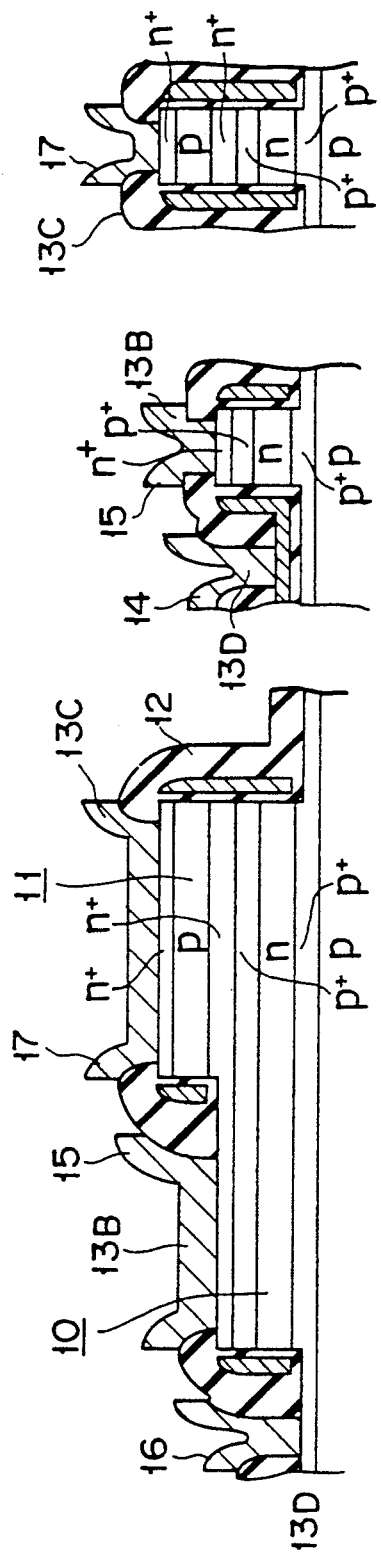

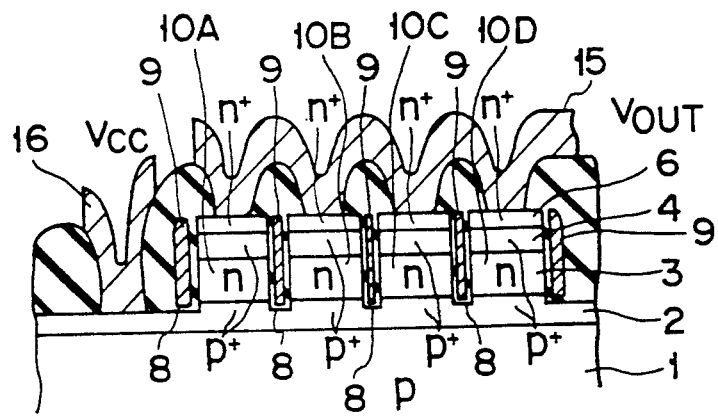
F I G. 12B
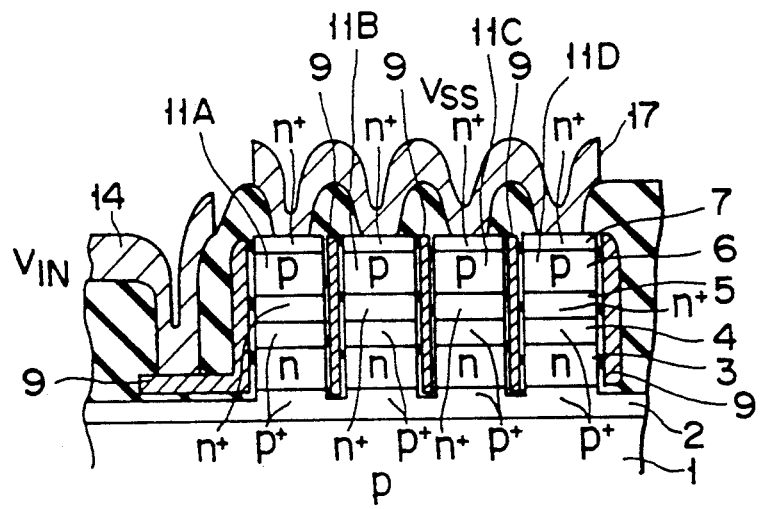
F I G. 12C

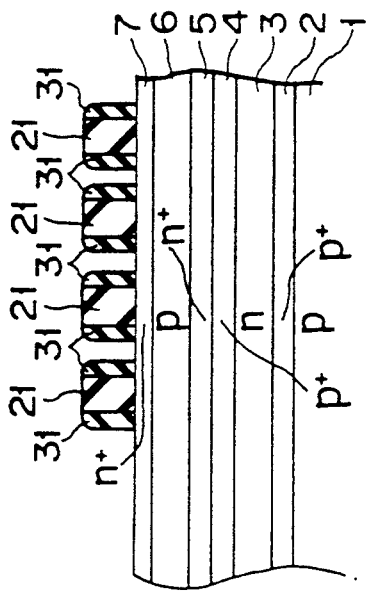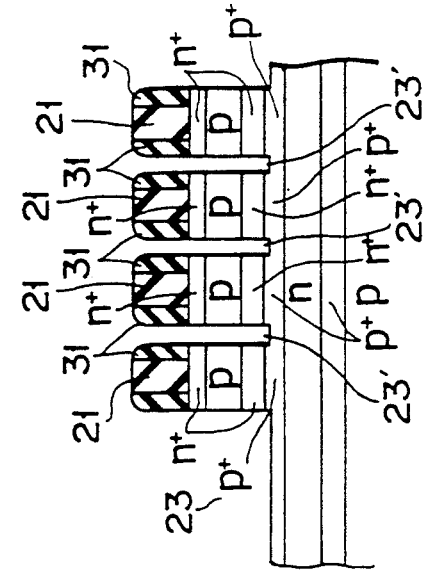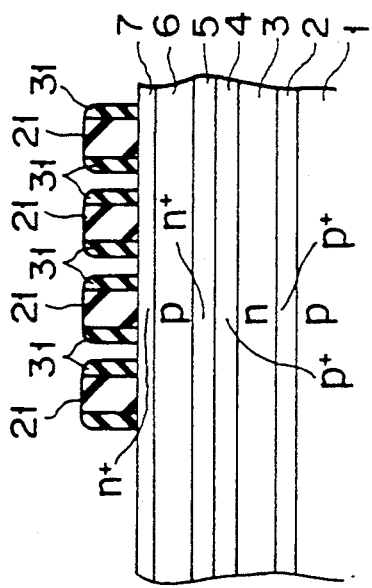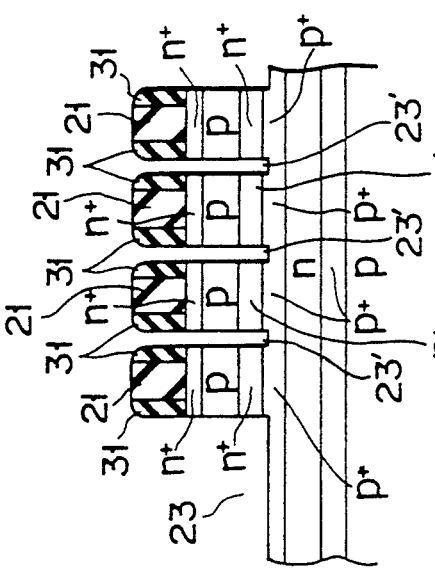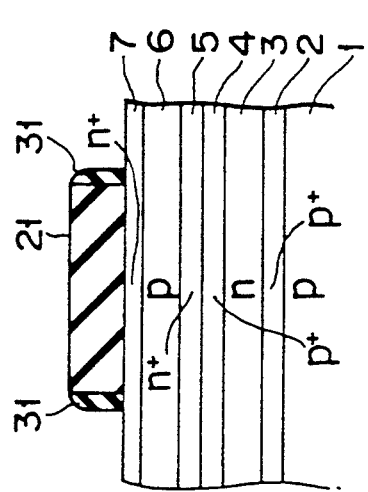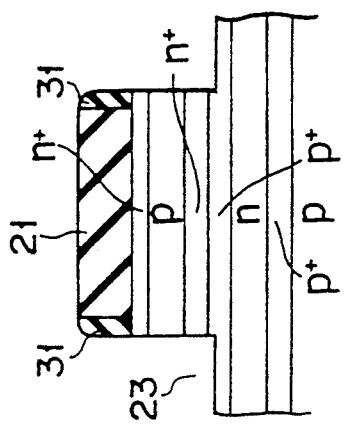
FIG. 15A  FIG. 15B  FIG. 15C
FIG. 16A  FIG. 16B  FIG. 16C

SEMICONDUCTOR VERTICAL MOSFET INVERTER CIRCUIT

BACKGROUND OF THE INVENTION

1. Field of the Invention

This invention relates to a semiconductor device, and more particularly to the improvement of an inverter circuit serving as a basic circuit of a digital integrated circuit.

2. Description of the Related Art

A semiconductor integrated circuit, particularly, an integrated circuit using a MOS transistor is developed with even higher integration density. With the formation of the integrated circuit with even higher integration density, the MOS transistor used in the integrated circuit is miniaturized into the sub-micron region. The basic circuit of the digital circuit is an inverter circuit. However, when the MOS transistors constituting the inverter circuit are miniaturized, the following problems may occur.

1) When the gate size of the MOS transistor is reduced, a so-called short channel effect causes punch-through between the source and drain thereof. As a result, it becomes difficult to suppress the leak current, thereby increasing the standby current in the inverter circuit.

2) When the intensity of the internal electric field of the MOS transistor becomes high, the threshold voltage and mutual conductance of the transistor may be varied by the hot carrier effect. As a result, deterioration in the transistor characteristic and deterioration in the circuit characteristic (operation speed, operation margin and the like) will occur.

3) When the gate length is reduced by miniaturization, the gate width must be made larger than a certain value in order to ensure a necessary amount of current. Therefore, it is difficult to sufficiently reduce the occupied area of the inverter circuit. For example, in a dynamic RAM (DRAM), the miniaturization technique for memory cells is markedly developed. However, since a necessary amount of current must be ensured in the peripheral circuit, the gate width cannot be reduced in many portions of the peripheral circuit, thereby preventing the whole portion of the DRAM chip from being miniaturized.

As described above, with the conventional MOS integration technique, problems that suppression of the leak current in the inverter circuit is difficult, the reliability is lowered by the hot carrier effect and the occupied area of the circuit cannot be reduced because it is required to ensure a necessary amount of current have occurred.

The related art of this invention is disclosed in Japanese Patent Disclosure Nos. 2-71556 and 2-188966.

SUMMARY OF THE INVENTION

An object of this invention is to provide a semiconductor device having a small occupied area and an excellent characteristic, and particularly, an inverter circuit section which is a basic circuit of a digital integrated circuit.

The semiconductor device of this invention is characterized by comprising a semiconductor substrate 1; at least one first column-shaped semiconductor layer 10 of a first channel type formed on said semiconductor substrate 1 in order of first, second and third regions, and having a side surface; at least one second column-shaped semiconductor layer 11 of a second channel type selectively laminated on said first column-shaped semiconductor layer 10 in order of first, second and third regions, and having a side surface; a gate insulation film 8 formed on the side surfaces of said first column-shaped semiconductor layer 10 and said second column-shaped semiconductor layer 11; a gate electrode 9 formed on said insulation film 8 to extend to an external portion of said first column-shaped semiconductor layer 10; a first source layer 2 and a first drain layer 4 respectively formed in the first and third region of said first column-shaped semiconductor layer 10; a second source layer 7 and a second drain layer 5 respectively formed in the first and third region of said second column-shaped semiconductor layer 11; an input terminal 14 connected to said gate electrode 9 lead out to the exterior of said first column-shaped semiconductor layer 10; an output terminal 15 connected to said second drain layer 5 formed on and in low-resistance contact with said first drain layer; a first power source terminal 16 connected to said first source layer 2 of said first column-shaped semiconductor layer 10; and a second power source terminal 17 connected to said second source layer 7; wherein said first source layer 2, first drain layer 4 and gate electrode 9 constitute a first MOS transistor and said second source layer 7, second drain layer 5 and gate electrode 9 constitute a second MOS transistor.

According to this invention, the sub-threshold characteristic of the MOS transistor is steep and the sub-threshold swing is extremely small. As will be described later in detail, the characteristics can be attained because the controllability for the gate channel is high. For this reason, the standby current of the inverter circuit constructed by the first and second MOS transistors can be effectively suppressed. The side wall of the column-shaped semiconductor layer serves as a channel region and the channel region does not have a portion which is formed in contact with the field region unlike the MOS transistor with ordinary plane structure. Therefore, the strong electric field created in the field end portion has little influence on the channel region, thereby suppressing the hot carrier effect.

Since the channel length can be increased by increasing the height of the column-shaped semiconductor layer, that is, increasing the depth of the groove without increasing the occupied area, the hot carrier effect can also be effectively suppressed. Since the hot carrier effect can be thus suppressed, an inverter circuit of high reliability can be obtained. Further, since the channel region is formed to surround the column-shaped semiconductor layer, a large gate width can be attained in a small occupied area and a significant effect of reducing the occupied area can be attained particularly in a portion in which a certain amount of or more current is necessary.

Further, since the first and second MOS transistors are formed on the substrate in a superposed configuration, the occupied area reducing effect is extremely large.

A characteristic having extremely small dependency on the substrate bias can be attained and the reliability of the circuit can be significantly enhanced by creating a structure in which the column-shaped semiconductor layer region can be electrically isolated from the underlying semiconductor region by use of an impurity diffused layer or a depletion layer formed to extend from the drain layer at the bottom portion of the groove at the time of channel inversion.

According to this invention, since the vertical type MOS transistors each having the side wall of the column-shaped semiconductor layer used as a channel are superposed in a vertical direction, a MOS transistor circuit whose occupied area is significantly reduced can be obtained. Further, since the channel region is not in contact with the field, the resistance to the hot carrier effect can be made high and an excellent circuit characteristic can be attained. In addition, the subthreshold characteristic is improved so that the current consumption at the standby can be made extremely small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 10C are cross sectional views showing the process of manufacturing the CMOS inverter circuit of the first embodiment;

FIGS. 12A to 12C are cross sectional views respectively taken along the lines 12A—12A, 12B—12B and 12C—12C of FIG. 11;

FIGS. 13A to 20C are cross sectional views showing the process of manufacturing the CMOS inverter circuit of the second embodiment.

DETAILED DESCRIPTION OF THE PREFERRED EMBODIMENTS

There will now be described an embodiment of this invention with reference to the accompanying drawings. In this embodiment, the explanation is directed to an inverter circuit, but this invention is not limited to the inverter circuit and may be applied a flip-flop circuit, for example.

Figure 1:
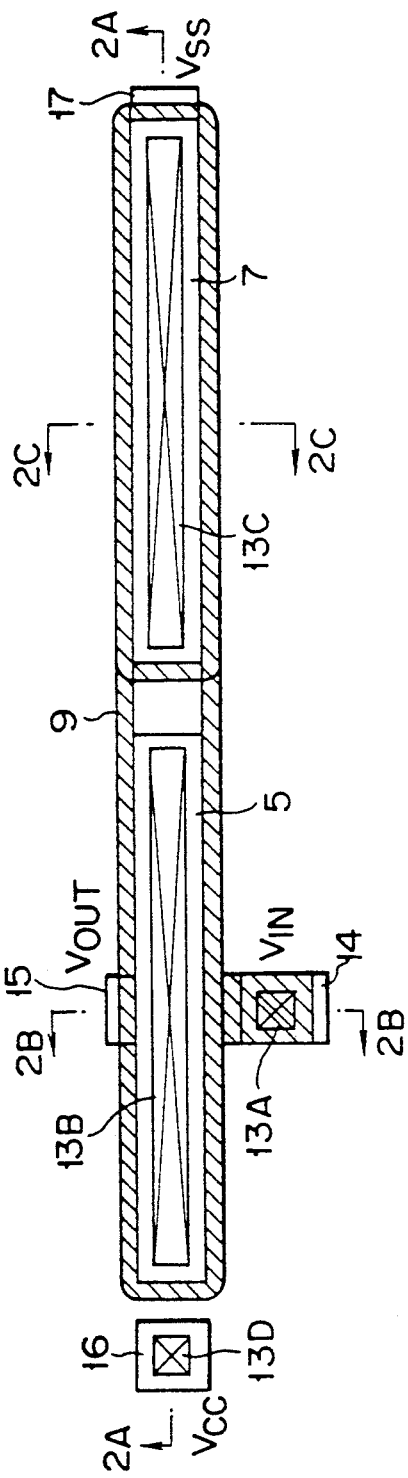
FIG. 1 is a plan view of a CMOS inverter circuit according to a first embodiment of this invention.
Figure 2A:
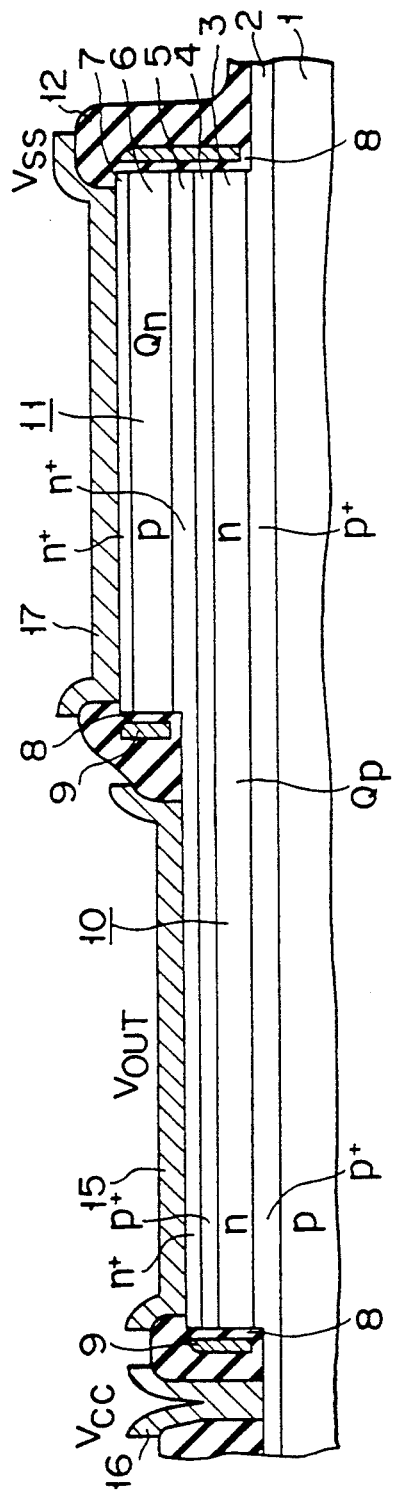
FIGS. 2A to 2C are cross sectional views respectively taken along the lines 2A—2A, 2B—2B and 2C—2C of FIG. 1.
Figure 2B:
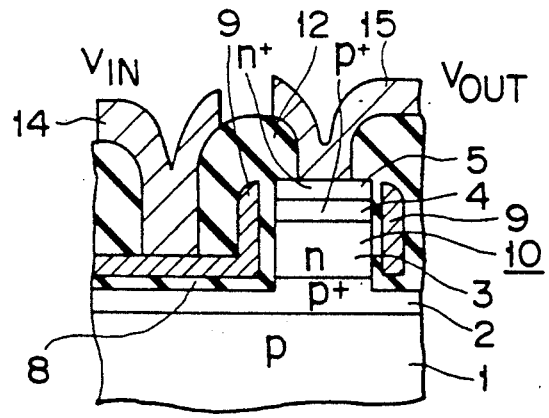
Figure 2C:
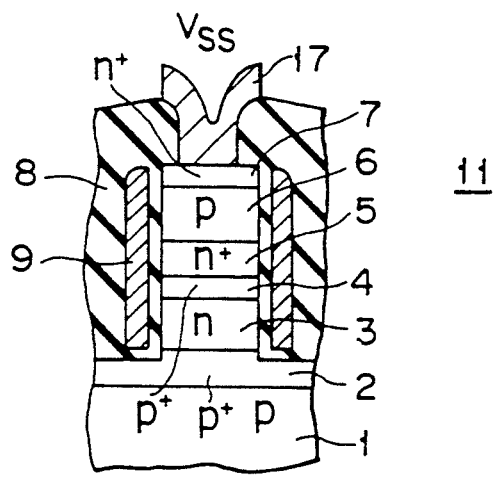
Figure 3:
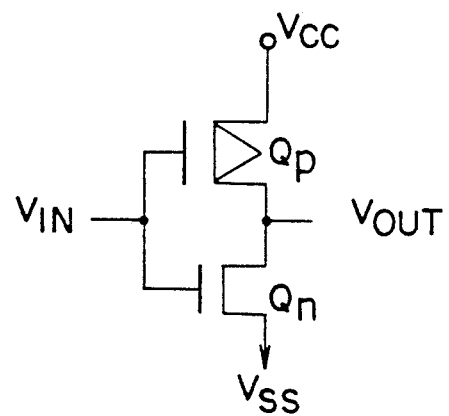
FIG. 3 is an equivalent circuit diagram of the CMOS inverter.

FIG. 1 is a plan view showing a CMOS inverter circuit section according to the first embodiment. FIGS. 2A to 2C are cross sectional views respectively taken along the lines 2A—2A, 2B—2B and 2C—2C of FIG. 1. FIG. 3 is an equivalent circuit diagram of the inverter circuit of FIG. 1.

A first column-shaped silicon layer 10 which is isolated from the remaining portion by a groove and formed to project in an island form and a second column-shaped silicon layer 11 which is formed to project and laminated on part of the first column-shaped silicon layer 10 are formed on or over a substrate 1. The first column-shaped silicon layer 10 is constructed by a laminated structure of a p+-type layer 2, n-type layer 3, p+-type layer 4 and n+-type layer 5 laminated in this order from the bottom. The second column-shaped silicon layer 11 is constructed by a laminated structure of the n+-type layer 5, p-type layer 6, and n+-type layer 7 laminated in this order from the bottom. A p-channel MOS transistor $Q_p$ is constructed by use of the first column-shaped silicon layer 10 of the above laminated structure and an n-channel MOS transistor $Q_n$ is constructed by us of the second column-shaped silicon layer 11 of the above laminated structure. That is, the p-channel MOS transistor $Q_p$ has the p+-type layer 2 at the bottom portion of the first column-shaped silicon layer 10 as a source layer, the p+-type layer 4 at the upper portion of the first column-shaped silicon layer 10 as a drain layer, and a gate electrode 9 formed on the side surface of the first column-shaped silicon layer 10 to surround the first column-shaped silicon layer 10 with a gate insulation film 8 disposed therebetween. The n-channel MOS transistor $Q_n$ has the n+-type layer 5 at the bottom portion of the second column-shaped silicon layer 11 as a drain layer, the n+-type layer 7 at the upper portion of the second column-shaped silicon layer 11 as a source layer, and the gate electrode 9 formed on the side surface of the second column-shaped silicon layer 11 to surround the second column-shaped silicon layer 1 with the gate insulation film 8 disposed therebetween. The gate electrode 9 is formed of a common polysilicon layer which is continuously formed for both of the transistors. The p+-type layer 4 which is the drain layer of the p-channel MOS transistor $Q_p$ and the n+-type layer 5 which is the drain layer of the n-channel MOS transistor $Q_n$ are formed in direct contact with each other to form a p+n+ junction and the p-channel MOS transistor $Q_p$ and the n-channel MOS transistor $Q_n$ are superposed and connected in low-resistance contact with each other.

Part of the gate electrode 9 is lead out to the side portion of the first column-shaped silicon layer 10 and connected to an input terminal ($V_{in}$) electrode 14 via a contact hole 13A. An output terminal ($V_{out}$) which is formed in contact with the n+-type layer 5 via a contact hole 13B is formed over the first column-shaped silicon layer 10. The p+-type layer 2 which is the source layer of the p-channel MOS transistor is formed to extend to the exterior of the end portion of the first column-shaped silicon layer 10, that is, to the bottom portion of the groove, and connected to a first power source terminal ($V_{cc}$) electrode 16 via a contact hole 13D. A second power source terminal ($V_{ss}$) electrode 17 is connected to the n+-type layer 7 which is the source layer of the n-channel MOS transistor $Q_n$ and is the upper portion of the second column-shaped silicon layer 11 via a contact hole 13C.

In this embodiment, since a structure in which the gate is formed to surround the side surface of the column-shaped silicon layer is used, the controllability for the gate channel is high. As a result, the subthreshold characteristic becomes steep and the standby current of the inverter circuit can be effectively suppressed. The channel region does not have a portion which is formed in contact with the field region unlike the MOS transistor of an ordinary plane structure. Therefore, the strong electric field created at the field end portion will not influence the channel region and the hot carrier effect can be suppressed. Further, since the channel length can be increased by increasing the height of the column-shaped semiconductor layer, that is, increasing the depth of the groove without increasing the occupied area, the hot carrier effect can be effectively suppressed.

Further, since the p-type layer 6 and n-type layer 3 having surface areas in which a channel is formed are both set in the electrically floating state, a characteristic having extremely small dependency on the substrate bias can be attained and it becomes highly resistant to noises.

FIGS. 4A to 10C show the process of manufacturing the CMOS inverter circuit of this embodiment. FIGS. 4A to 4C are cross sectional views corresponding to FIGS. 2A to 2C, and the same portions are denoted by the same reference numerals. This is also applied to FIGS. 5A to 10C. The manufacturing process is explained below.

1) As shown in FIGS. 4A to 4C, a multi-layered structure of laminated impurity layers including the $p^+$-type layer 2, n-type layer 3, $p^+$-type layer 4, $n^+$-type layer 5, p-type layer 6 and $n^+$-type layer 7 is formed on the p-type silicon substrate 1. The multi-layered structure can be obtained by repeatedly effecting the ion implantation and epitaxial growth. It is also possible to obtain the multi-layered structure by preparing two substrates, forming desired impurity layers on the respective substrates and then bonding the substrates together by use of the direct bonding technique. Next, a silicon oxide film (or silicon nitride film or a laminated film formed of the above films) 2 is formed on the entire surface of the wafer and a resist pattern 22 is formed on the film by use of the lithography technology.

2) As shown in FIGS. 5A to 5C, the silicon oxide film 21 is etched with the resist pattern 22 used as a mask and the wafer is etched with the remaining portion of the silicon oxide film 21 used as a mask so as to form a first groove 23 which substantially reaches the $p^+$-type layer 4. The column-shaped silicon layer region is isolated from the remaining portion by the above step.

3) As shown in FIGS. 6A to 6C, a resist pattern 24 is formed to cover part of the column-shaped silicon layer region by use of the lithography technology again and then the silicon oxide film 21 is etched with the resist pattern 24 used as a mask.

4) As shown in FIGS. 7A to 7C, the wafer is etched with the remaining portion of the silicon oxide film 21 used as a mask so as to form a second groove 25 which reaches the $n^+$-type layer 5. In this step, the column-shaped silicon layer region is formed into a stepped structure having the first column-shaped silicon layer 10 of the height from the $p^+$-type layer 2 to the $n^+$-type layer 5 and the second column-shaped silicon layer 11 of the height from the $n^+$-type layer 5 to the $n^+$-type layer 7 formed on part of the first column-shaped silicon layer 10. A portion of the first groove 23 is etched at the same time as formation of the second groove 25 and the first groove 23 has a depth to reach the $p^+$-type layer 2.

5) As shown in FIGS. 8A to 8C, the gate insulation film 8 is formed by the thermal oxidation after the silicon oxide film 21 used as the mask is removed, and then a layer of gate electrode material such as a polysilicon layer 90 is formed by deposition. After this, a resist pattern 26 for the patterning portion is formed in a terminal lead-out portion for the gate electrode by the lithography technology.

6) As shown in FIGS. 9A to 9C, the polysilicon layer 90 is etched by the anisotropic etching technique such as reactive ion etching to form the gate electrode 9 in self-alignment with the side surfaces of the column-shaped silicon layers 10 and 11.

7) As shown in FIGS. 10A to 10C, an inter-level insulation film 12 such as a CVD silicon oxide film is formed by deposition, the contact holes 13A to 13D are formed in the inter-level insulation layer 12, and then the terminal electrodes 14 to 17 of Al, for example, are formed to complete the CMOS inverter.

Figure 11:
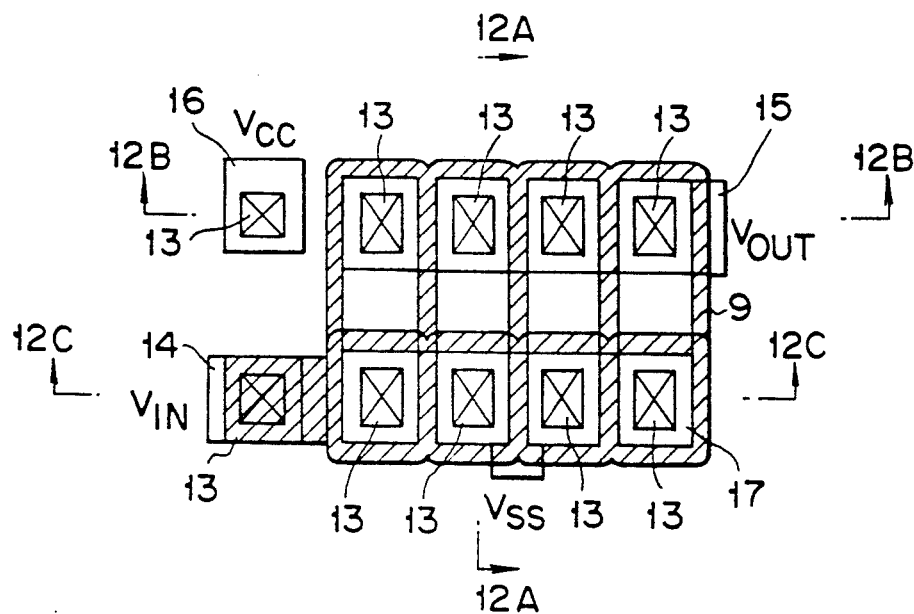
FIG. 11 shows a plan view of a CMOS inverter circuit of a second embodiment.
Figure 12A:
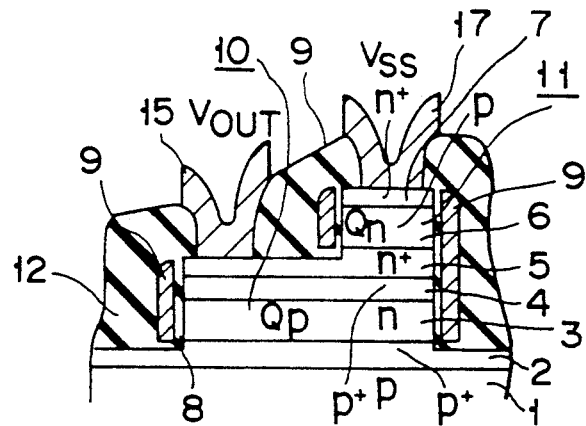

FIG. 11 is a plan view of a CMOS inverter according to a second embodiment of this invention and FIGS. 12A to 12C are cross sectional views taken along the lines 12A—12A, 12B—12B and 12C—12C of FIG. 11. In this embodiment, portions which are the same as those in the former embodiment are denoted by the same reference numerals and the explanation therefore is omitted. In the former embodiment, the second column-shaped silicon layer 11, in which the n-channel MOS transistor is formed, is formed on part of the first column-shaped silicon layer 10 in which the p-channel MOS transistor is formed to provide a stepped structure. In contrast to the first embodiment, in this embodiment, the first column-shaped silicon layer 10 is formed as a set of a plurality of small column-shaped silicon layers 10A to 10D and the second column-shaped silicon layer 11 is formed as a set of a plurality of small column-shaped silicon layers 11A to 11D which are respectively formed on the small column-shaped silicon layers 10A to 10D. That is, the structure of FIG. 12A which is a cross sectional view taken along the line 12A—12A of FIG. 11 is the same as that of FIG. 2A in the former embodiment and the second column-shaped silicon layer 11 is formed on part of the first column-shaped silicon layer 10. As is clearly shown in FIGS. 12B and 12C, which are cross sectional views respectively taken along the lines 12B—12B and 12C—12C of FIG. 11, the first column-shaped silicon layer 10 and the second column-shaped silicon layer 11 are divided into small sections. The distance between the divided column-shaped silicon layers 10 and 11 is set to a value which is sufficiently large and necessary for permitting the gate electrode to be formed between the adjacent divided sections, and as is clearly shown in FIGS. 12B and 12C, the gate electrodes 9 are formed to surround the respective divided column-shaped silicon layers. Like the former embodiment, a p-channel MOS transistor $Q_p$ is formed in the first column-shaped silicon layer 10 lying on the lower side and an n-channel MOS transistor $Q_n$ is formed in the second column-shaped silicon layer 11 lying on the upper side in this embodiment. Further, like the former embodiment, the gate electrode 9 is continuously formed for the p-channel MOS transistor $Q_p$ and n-channel MOS transistor $Q_n$ in this embodiment.

Figure 13A:
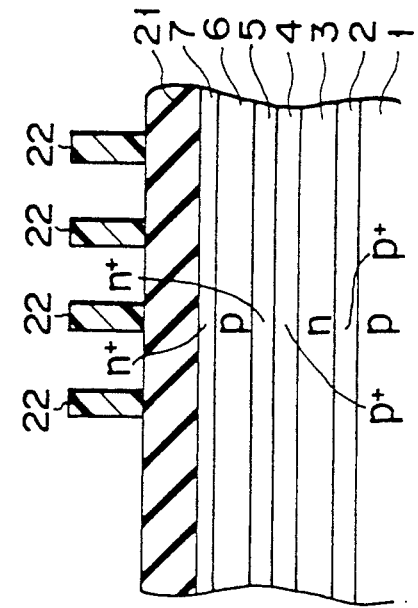

FIGS. 13A to 20C show the process for manufacturing the CMOS inverter circuit of the second embodiment. FIGS. 13A to 13C are cross sectional views corresponding to FIGS. 2A to 2C and the same portions are denoted by the same reference numerals. This is also applied to FIGS. 14A to 20C. The manufacturing process is explained below.

Figure 13B:
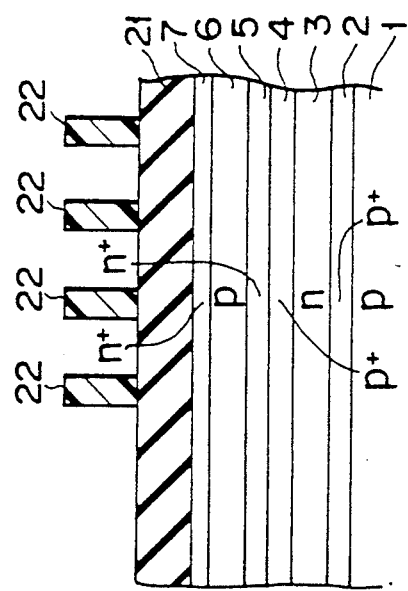
Figure 13C:
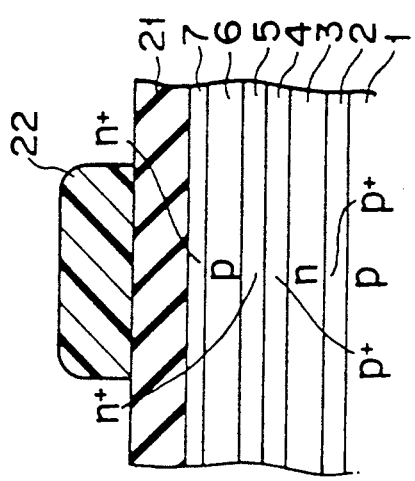

1) As shown in FIGS. 13A to 13C, a wafer which has a multi-layered structure of impurity layers and which is the same as that of the former embodiment is formed.

A silicon oxide film (or silicon nitride film or a laminated film formed of the above films) 21 is formed on the wafer and a resist pattern 22 is formed on the silicon nitride film 21 by the lithography technology.

Figure 14A:
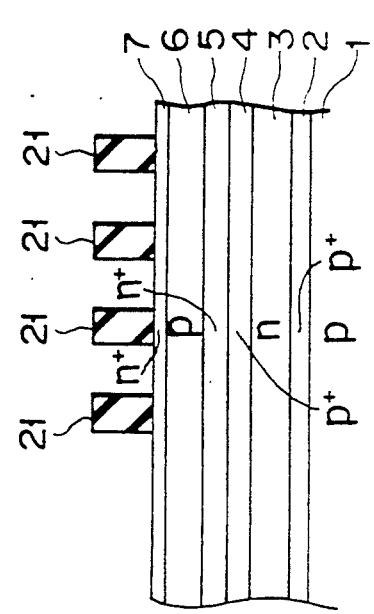
Figure 14B:
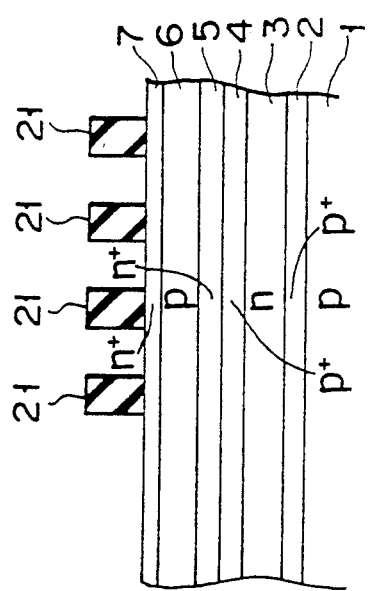
Figure 14C:
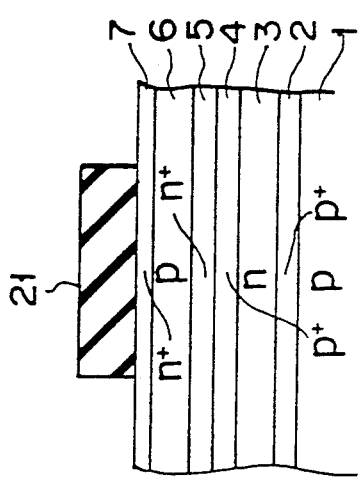

2) The silicon oxide film 21 is etched with the resist pattern used as a mask, and as shown in FIGS. 14A to 14C, the silicon oxide film 21 is patterned. After this, a silicon oxide film (or silicon nitride film) 31 is formed again by deposition and etched by the anisotropic etching such as reactive ion etching.

3) As shown in FIGS. 15A to 15C, that portion of the silicon oxide film 31 which lies on the side walls of the previously patterned silicon oxide film 21 is left. Then, the wafer is etched by the anisotropic etching with the silicon oxide films 21 and 31 as a mask.

4) As shown in FIGS. 16A to 16C, first grooves 23 for isolating the column-shaped regions from one another are formed to reach the p+-type layer 4. In this step, grooves 23' for dividing the column-shaped silicon layer into small sections are also formed.

Figure 17A:
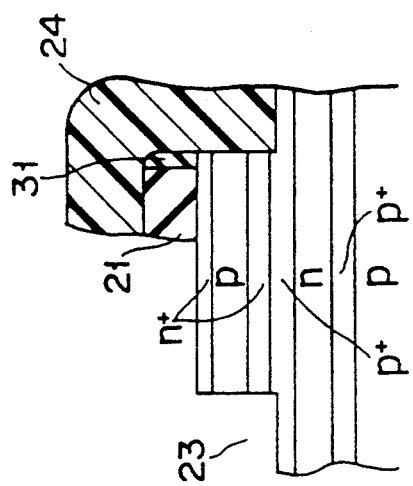
Figure 17B:
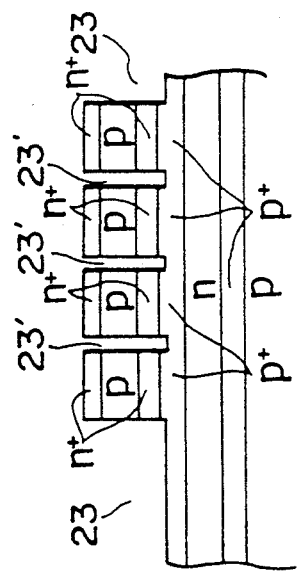
Figure 17C:
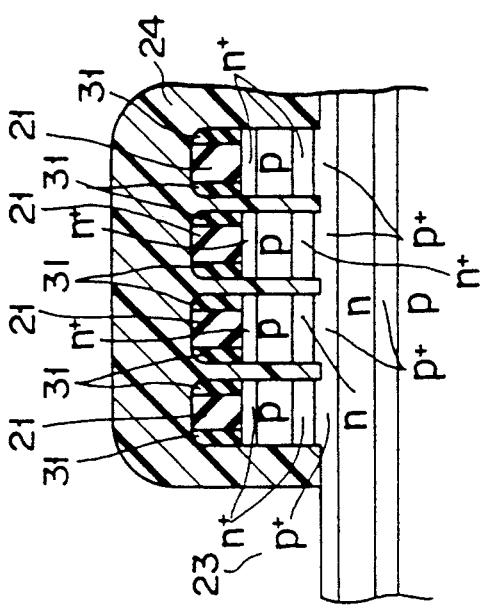

5) As shown in FIGS. 17A to 17C, a resist pattern 24 covering part of the column-shaped silicon layer region is formed by use of the lithographic technology and then the silicon oxide films 21 and 31 are removed by etching by using the resist pattern 24 as a mask.

Figure 18A:
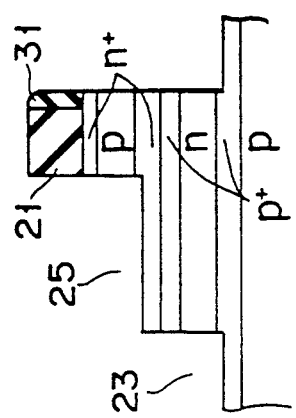
Figure 18B:
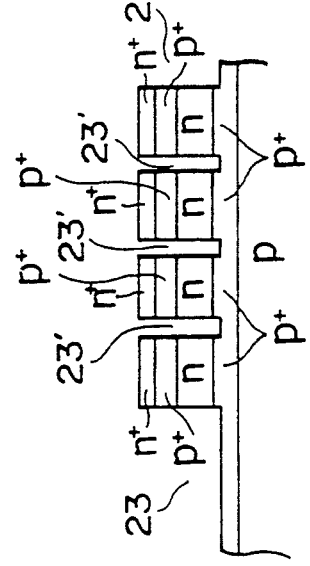
Figure 18C:
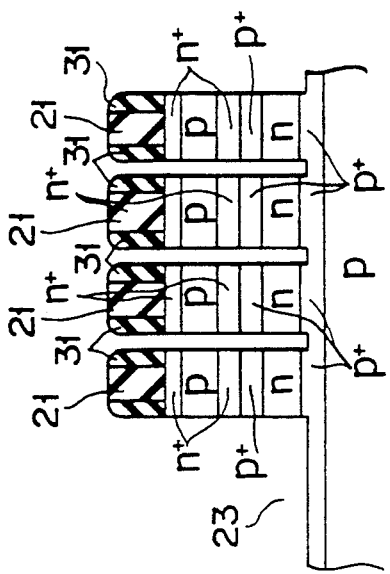

6) The wafer is etched by the anisotropic etching with the remaining silicon oxide films 21 and 31 used as a mask, and as shown in FIGS. 18A to 18C, a second groove 25 having a depth to reach the n+-type layer 5 is formed in part of the column-shaped silicon layer region. The grooves 23 and 23' formed in the step 4) are etched to a depth to reach the p+-type layer 2 so as to provide a structure which is formed of the first column-shaped silicon layer 10 and the second column-shaped silicon layer 11 left behind on the first column-shaped silicon layer 10 in a stepped form. Each of the first and second column-shaped silicon layers 10 and 11 are divided into small sections by the grooves 23'.

Figure 19C:
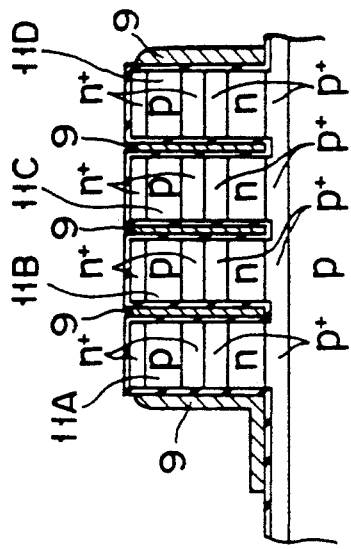
Figure 19B:
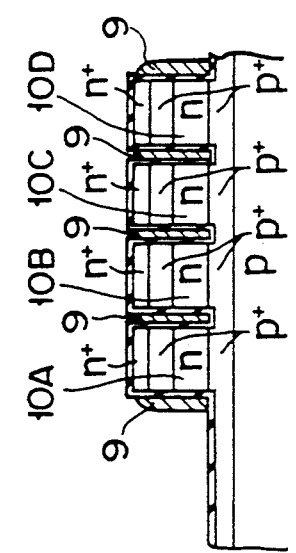
Figure 19A:
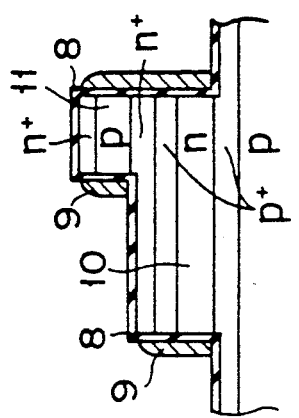

7) As shown in FIGS. 19A to 19C, after the mask material used for forming the groove by etching is removed, the gate insulation film 8 is formed. After this, the gate electrode material, for example, polysilicon layer is deposited and the anisotropic etching is effected to form the gate electrodes 9 on the side surfaces of the first and second column-shaped silicon layers 10 and 11. At this time, the polysilicon etching is effected by the lithography technology with the resist film left behind on the gate electrode lead-out section or the contact portion of the input terminal electrode so as to leave the polysilicon on the gate electrode lead-out section.

Figure 20C:
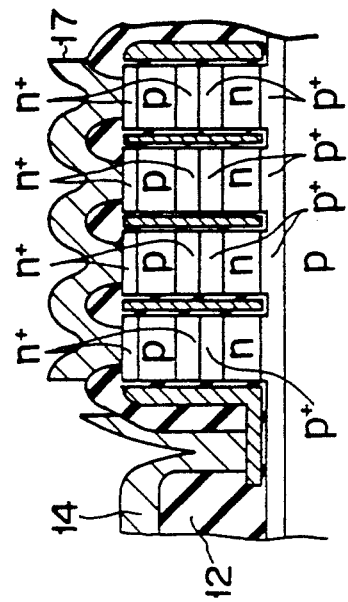
Figure 20B:
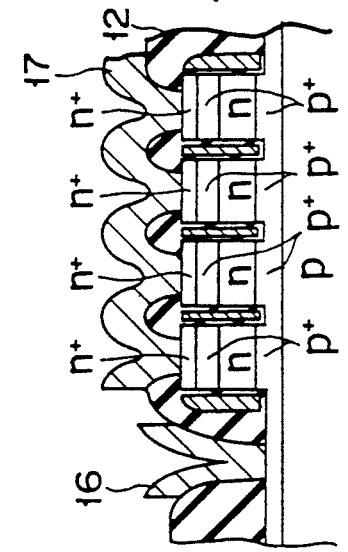
Figure 20A:
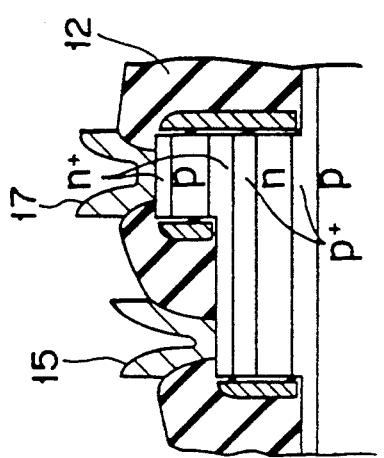

8) As shown in FIGS. 20A to 20C, an inter-level insulation film 12 such as a CVD silicon oxide film is deposited, and after contact holes are formed, terminal electrodes 14 to 17 formed of Al, for example, are formed.

The CMOS inverter is completed by the above step. In the CMOS inverter of this embodiment, an inverter circuit in which the standby current is small and which is highly resistant to the hot carrier effect and substrate noises can be realized for the same reasons as in the first embodiment.

Reduction in the occupied area of the CMOS inverter circuit according to the first and second embodiments is explained with reference to FIG. 21.

Figure 21:
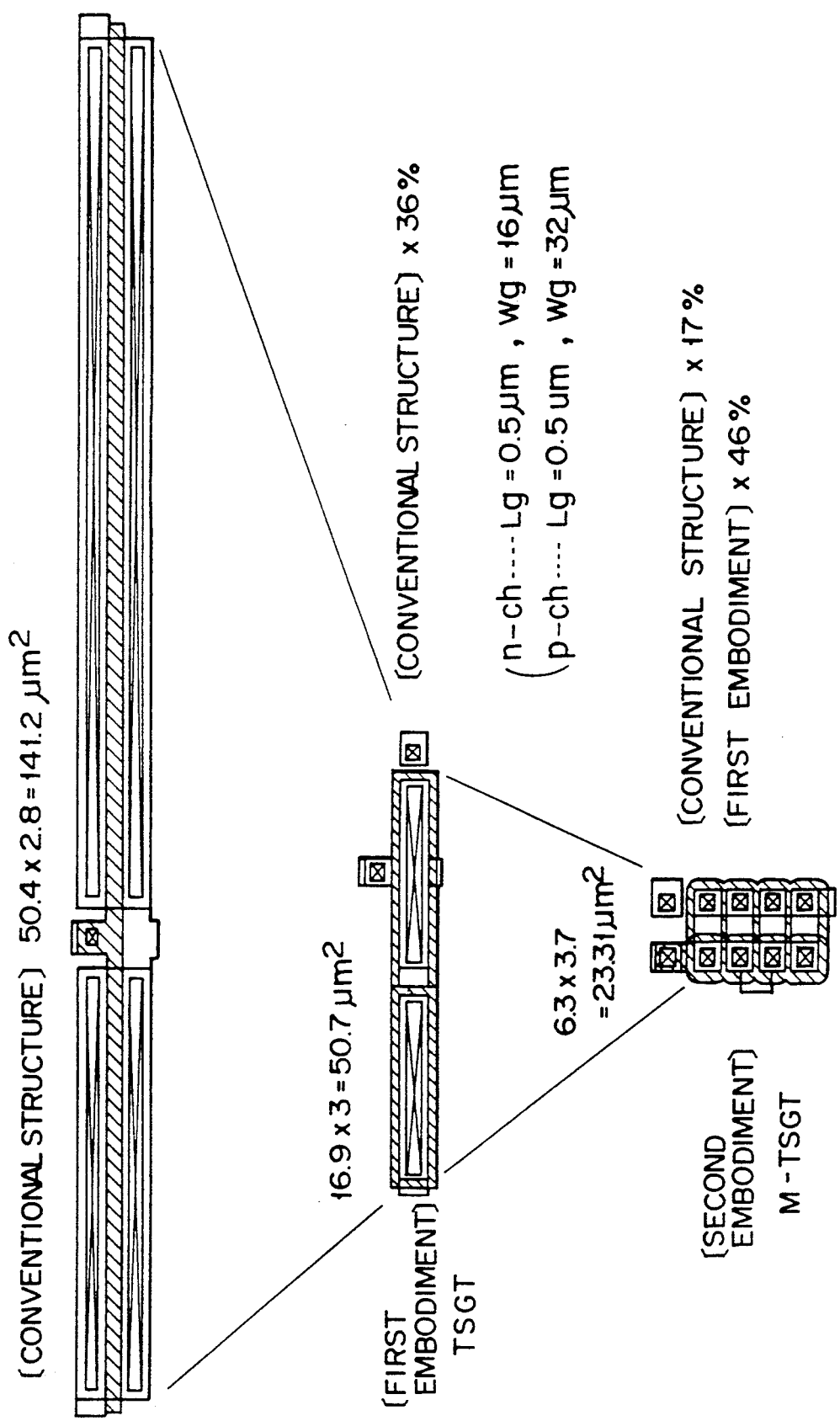
FIG. 21 is a diagram showing the occupied areas of the CMOS inverter circuits of the first and second embodiments in comparison with the occupied area of the conventional structure.

As shown in the upper half portion of FIG. 21, the CMOS inverter circuit according to the first embodiment can be formed with an extremely small occupied area which is approximately 36% of that of the CMOS inverter circuit formed by use of MOS transistors of an ordinary plane structure according to the 0.5 μm design rule. The reason for this is that p- and n-channel MOS transistors are arranged in a plane and well isolation is required in a case of the inverter constructed by the plane transistors, but in the first embodiment of this invention, the n-channel MOS transistor is formed on the p-channel MOS transistor and an area required for well isolation is not used.

The CMOS inverter circuit according to the second embodiment can be formed with an occupied area which is approximately 46% of that of the CMOS inverter circuit of the first embodiment according to the 0.5 μm design rule and is approximately 17% of that of the conventional CMOS inverter circuit using the plane transistor structure. Therefore, according to the second embodiment, significant reduction in the occupied area can be attained. The reason for this is that the column-shaped silicon layer is divided into small sections in this embodiment so that a large gate width can be attained in a limited area.

In addition, since the occupied area is reduced, the junction capacitance can be reduced, and as a result, it becomes possible to enhance the operation speed of the inverter circuit.

This invention is not limited to the above embodiments. For example, the following structures can be used.

1) In the above embodiments, the n-channel MOS transistor is formed on the p-channel MOS transistor, but it is also possible to form the p-channel MOS transistor on the n-channel MOS transistor.

2) Further, MOS transistors of the same channel can be superposed on each other in substantially the same structure.

3) In the above embodiments, the source and drain diffused layers are formed of impurity layers of high impurity concentration, but an LDD structure having impurity layers of low impurity concentration may be used.

4) Further, the channel structure is not limited to the surface channel type and may be formed of buried channel type.

5) An n-type substrate can be used as the substrate. When the n-type substrate is used, the p+-type layer 2 which serves as the source layer of the p-channel MOS transistor is not necessarily formed on the entire surface of the column-shaped silicon layer across the column-shaped silicon layer and may be formed only on the side surface of the column-shaped silicon layer, that is, on the bottom portion of the groove.

6) In the above embodiments, only one second column-shaped semiconductor layer is formed on the first column-shaped semiconductor layer as an example, but a plurality of second column-shaped semiconductor layers may be formed on the first column-shaped semiconductor layer.

7) In this embodiment, the inverter circuit is explained as an example, but this invention can be applied not only to the inverter circuit but also to other circuits such as a flip-flop.

This invention can be variously modified without departing from the technical scope thereof.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device comprising: a semiconductor substrate (1);
   at least one first column-shaped semiconductor layer (10) of a first channel type formed on said semiconductor substrate (1) in order of first, second and third regions, and having a side surface;
   at least one second column-shaped semiconductor layer (11) of a second channel type selectively laminated on said first column-shaped semiconductor layer (10) in order of first, second and third regions, and having a side surface;
   a gate insulation film (8) formed on the side surfaces of said first column-shaped semiconductor layer (10) and said second column-shaped semiconductor layer (11);
   a gate electrode (9) completely surrounding said first and second column-shaped semiconductor layers (10) and (11), and formed on said insulation film (8) to extend to an external portion of said first column-shaped semiconductor layer (10);
   a first source layer (2) and a first drain layer (4) respectively formed in the first and third region of said first column-shaped semiconductor layer (10);
   a second drain layer (5) and a second source layer (7) respectively formed in the first and third region of said second column-shaped semiconductor layer (11);
   an input terminal (14) connected to said gate electrode (9) lead out to the exterior of said first column-shaped semiconductor layer (10);
   an output terminal (15) connected to said second drain layer (5) formed on and in low-resistance contact with said first drain layer (4);
   a first power source terminal (16) connected to said first source layer (2) of said first column-shaped semiconductor layer (10); and
   a second power source terminal (17) connected to said second source layer (7);
   wherein said first source layer (2), first drain layer (4) and gate electrode (9) constitute a first MOS transistor and said second source layer (7), second drain layer (5) and gate electrode (9) constitute a second MOS transistor.

2. A semiconductor device comprising:
   a semiconductor substrate (1);
   at least one first column-shaped semiconductor layer (10) of a first channel type formed on said semiconductor substrate (1) in order of first, second and third regions, and having a side surface;
   at least one second column-shaped semiconductor layer (11) of a second channel type selectively laminated on said first column-shaped semiconductor layer (10) in order of first, second and third regions and having a side surface;
   a gate insulation film (8) formed on the side surfaces of said first column-shaped semiconductor layer (10) and said second column-shaped semiconductor layer (11);
   a gate electrode (9) surrounding said first and second column-shaped semiconductor layer (10) and (11) and formed on said insulation film (8) to extend to an external portion of said first column-shaped semiconductor layer (10);
   a first source layer (2) and a first drain layer (4) respectively formed in the first and third region of said first column-shaped semiconductor layer (10);
   a second drain layer (5) and a second source layer (7) respectively formed in the first and third region of said second column-shaped semiconductor layer (11);
   an input terminal (15) connected to said gate electrode (9) lead out to the exterior of said first column-shaped semiconductor layer (10);
   an output terminal (15) connected to said second drain layer (5) formed on and in low-resistance contact with said first drain layer (4);
   a first power source terminal (16) connected to said first source layer (2) of said first column-shaped semiconductor layer (10); and
   a second power source terminal (17) connected to said second source layer (7);
   wherein said first source layer (2), first drain layer (4) and gate electrode (9) constitute a first MOS transistor and said second source layer (7), second drain layer (5) and gate electrode (9) constitute a second MOS transistor, and said first column-shaped semiconductor layer (10) is constructed by at least two column-shaped semiconductor layers and at least open of said second column-shaped semiconductor layers (11) is selectively formed on said first column-shaped semiconductor layer (10).

3. A semiconductor device comprising:
   a semiconductor substrate (1);
   at least one first column-shaped semiconductor layer (10) of a first channel type formed on said semiconductor substrate (1) in order of first, second and third regions, and having a side surface;
   at least one second column-shaped semiconductor layer (11) of a second channel type selectively laminated on said first column-shaped semiconductor layer (10) in order of first, second and third regions, and having a side surface;
   a gate insulation film (8) formed on the side surfaces of said first column-shaped semiconductor layer (10) and said second column-shaped semiconductor layer (11);
   a gate electrode (9) completely surrounding said first and second column-shaped semiconductor layer (10) and (11), and formed on said insulation film (8) to extend to an external portion of said first column-shaped semiconductor layer (10);
   a first source layer (2) and a first drain layer (4) respectively formed in the first and third region of said first column-shaped semiconductor layer (10); and
   a second drain layer (5) and a second source layer (7), respectively formed in the first and third region of said second column-shaped semiconductor layer (11);
   wherein said first source layer (2), first drain layer (4) and gate electrode (9) constitute a first MOS transistor and said second source layer (7), second drain layer (5) and gate electrode (9) constitute a second MOS transistor.

4. A semiconductor device comprising:
   a semiconductor substrate (1);
   at least one first column-shaped semiconductor layer (10) of a first channel type formed on said semiconductor substrate (1) in order of first, second and third regions, and having a side surface;

at least one second column-shaped semiconductor layer (11) of a second channel type selectively laminated on said first column-shaped semiconductor layer (10) in order of first, second and third regions, and having a side surface;

a gate insulation film (8) formed on the side surfaces of said first column-shaped semiconductor layer (10) and said second column-shaped semiconductor layer (11);

a gate electrode (9) surrounding said first and second column-shaped semiconductor layer (10) and (11), and formed on said insulation film (8) to extend to an external portion of said first column-shaped semiconductor layer (10);

a first source layer (2) and a first drain layer (4) respectively formed in the first and third region of said first column-shaped semiconductor layer (10); and a second drain layer (5) and a second source layer (7) respectively formed in the first and third region of said second column-shaved semiconductor layer (11);

wherein said first source layer (2), first drain layer (4) and gate electrode (9) constitute a first MOS transistor and said second source layer (7), second drain layer (5) and gate electrode (9) constitute a second MOS transistor, and said first column-shaped semiconductor layer (10) is constructed by at least two column-shaped semiconductor layers and at least one of said second column-shaped semiconductor layers (11) is selectively formed on said first column-shaped semiconductor layer (10).

5. A semiconductor device according to claim 3, wherein said first and second MOS transistors are respectively formed of MOS transistors of the first and second channel types constituting a CMOS transistor.

6. A semiconductor device according to claim 5, further comprising:
an input terminal (14) connected to said gate electrode (9) lead out to the exterior of said first column-shaped semiconductor layer (10);
an output terminal (15) connected to said second drain layer (5) formed on and in low-resistance contact with said first drain layer; 'a first power source terminal (16) connected to said first source layer (2) of said first column-shaped semiconductor layer (10); and
a second power source terminal (17) connected to said second source layer (7).

7. A semiconductor device according to claim 6, wherein said first column-shaped semiconductor layer (10) is constructed by at least two column-shaped semiconductor layers and at least one of said second column-shaped semiconductor layers (11) is selectively formed on said first column-shaped semiconductor layer (10).

8. A semiconductor device comprising:
a semiconductor substrate (1);
at least one first column-shaped semiconductor layer (10) of a first channel type formed on said semiconductor substrate (1) in order of first, second and third regions, and having a side surface;
at least one second column-shaped semiconductor layer (11) having the same channel type as that of said first column-shaped semiconductor layer (10), selectively laminated on said first column-shaped semiconductor layer (10) in order of first, second and third regions, and having a side surface;
a gate insulation film (8) formed on the side surfaces of said first column-shaped semiconductor layer (10) and said second column-shaped semiconductor layer (11);

a gate electrode (9) completely surrounding said first and second column-shaped semiconductor layer (10) and (11), and formed on said insulation film (8) to extend to an external portion of said first column-shaped semiconductor layer (10);

a first source layer (2) and a first drain layer (4) respectively formed in the first and third region of said first column-shaped semiconductor layer (10); and a second drain layer (5) and a second source layer (7) respectively formed in the first and third region of said second column-shaped semiconductor layer (11);

wherein said first source layer (2), first drain layer (4) and gate electrode (9) constitute a first MOS transistor and said second source layer (7), second drain layer (5) and gate electrode (9) constitute a second MOS transistor.

9. A semiconductor device comprising:
a semiconductor substrate (1);
at least one first column-shaped semiconductor layer (10) of a first channel type formed on said semiconductor substrate (1) in order of first, second and third regions, and having a side surface;
at least one second column-shaped semiconductor layer (11) having the same channel type as that of said first column-shaped semiconductor layer (10), selectively laminated on said first column-shaped semiconductor layer (10) in order of first, second and third regions, and having a side surface;
a gate insulation film (8) formed on the side surfaces of said first column-shaped semiconductor layer (10) and said second column-shaped semiconductor layer (11);

a gate electrode (9) surrounding said first and second column-shaped semiconductor layer (10) and (11), and formed on said insulation film (8) to extend to an external portion of said first column-shaped semiconductor layer (10);

a first source layer (2) and a first drain layer (4) respectively formed in the first and third region of said first column-shaped semiconductor layer (10); and a second drain layer (5) and a second source layer (7) respectively formed in the first and third region of said second column-shaped semiconductor layer (11);

wherein said first source layer (2), first drain layer (4) and gate electrode (9) constitute a first MOS transistor and said second source layer (7), second drain layer (5) and gate electrode (9) constitute a second MOS transistor, and said first column-shaped semiconductor layer (10) is constructed by at least two column-shaped semiconductor layers and at least one of said second column-shaped semiconductor layers (11) is selectively formed on said first column-shaped semiconductor layer (10).

10. A semiconductor device according to claim 8, further comprising:
an input terminal (14) connected to said gate electrode (9) lead out to the exterior of said first column-shaped semiconductor layer (10);
an output terminal (15) connected to said second drain layer (5) formed on and in low-resistance contact with said first drain layer;
a first power source terminal (16) connected to said first source layer (2) of said first column-shaped semiconductor layer (10); and
a second power source terminal (17) connected to said second source layer (7).

* * * * *